(12) United States Patent
Lee et al.

(10) Patent No.: US 7,324,614 B2
(45) Date of Patent: Jan. 29, 2008

(54) HIGH SPEED DECODER

(75) Inventors: Seok-Jun Lee, Savoy, IL (US); Manish Goel, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 706 days.

(21) Appl. No.: 10/322,874

(22) Filed: Dec. 18, 2002

(65) Prior Publication Data

US 2004/0120427 A1 Jun. 24, 2004

(51) Int. Cl.
*H04D 1/00* (2006.01)
*H03M 13/03* (2006.01)
(52) U.S. Cl. ...................... 375/341; 714/794
(58) Field of Classification Search ............... 375/341, 375/262; 714/794, 795
See application file for complete search history.

(56) References Cited

U.S. PATENT DOCUMENTS

| | | | |
|---|---|---|---|
| 5,729,517 A * | 3/1998 | Fujiwara et al. | 369/59.22 |
| 6,373,413 B1 * | 4/2002 | Yoshinaka | 341/94 |
| 6,674,816 B2 * | 1/2004 | Shieh | 375/341 |
| 6,732,326 B2 * | 5/2004 | Choi et al. | 714/790 |
| 2003/0101403 A1 * | 5/2003 | Jeon et al. | 714/755 |

* cited by examiner

*Primary Examiner*—Khai Tran
(74) *Attorney, Agent, or Firm*—Wade James Brady, III; Frederick J. Telecky, Jr.

(57) ABSTRACT

A branch metric duplication method substantially reduces interconnection delays. The branch metric duplication method is particularly useful to implement a high speed radix-4 Viterbi decoder targeted for FPGA applications. The decoder includes a plurality of branch metric computation units (BMCUs), at least one add-compare-select unit (ACSU) having a plurality of cells, and a survivor path memory unit (SMU). The plurality of BMCUs, the at least one ACSU, and the SMU are configured to implement the decoder.

19 Claims, 3 Drawing Sheets

HIGH SPEED DECODER

BACKGROUND OF THE INVENTION

1. Field of the Invention

This invention relates generally to Viterbi decoders. More particularly, this invention relates to a branch metric unit duplication method to achieve high speed decoder field programmable gate array (FPGA) implementation.

2. Description of the Prior Art

A Viterbi decoder performs an optimum decoding of convolutionally encoded digital sequences. It is widely used in digital communication systems with data rates ranging from few kbps in narrowband applications to several hundreds of Mbps in broadband applications like Wireless LAN.

As shown in FIG. 1, a Viterbi decoder 100 is comprised of three units: a branch-metric computation unit (BMU) 102, an add-compare select unit (ACSU) 104 and a survivor path memory unit (SMU) 106. The input data is used in the BMU 102 to calculate the set of branch metrics for each new time step. These metrics are then fed to the ACSU 104 that accumulates the branch metrics recursively through the trace-back latch unit 108 as path metrics according to the trellis determined by a convolutional encoder polynomial. The SMU 106 processes the decisions being made in the ACSU 104 and outputs an estimated path, with a latency of trace-back depth.

It is clear that ACSU 104 and SMU 106 architectures depend only on the trellis and hence these two units are independent of the application for which a Viterbi decoder is being used. The application specific computations are done in the BMU 102 according to soft input definition; and the interpretation of the decoded path into data at the output of the SMU 106 is also dependent upon the output format definition. Since the application specific parts of a Viterbi decoder are mainly found at the input and output, the high speed architecture of ACSU 104 can be generally applicable.

If a high speed Viterbi decoder needs to be implemented for broadband applications with greater than 100 Mbps data rates, the critical path of a Viterbi decoder must be minimized. By looking at the block diagram of a Viterbi decoder 100 in FIG. 1, it is obvious that the BMU 102 as well as the SMU 106 are purely feedforward and the throughput can easily be increased by massive pipelining. However, this does not hold for the ACSU 104 because of the feedback loop through the trace-back latch unit 108.

One way to improve the throughput of ACSU 104 is to apply a look-ahead scheme (radix-4 architecture) to the trellis 200 as shown in FIG. 2. A radix-4 architecture achieves a double data rate without increasing the clock rate because a radix-4 architecture can run at the clock rates employed by a radix-2 architecture. The circuit complexity associated with a conventional radix-4 architecture is greater however, as can be seen with reference to FIG. 3 and FIG. 4, where a conventional radix-4 ACSU 400 basically requires 2-stage comparison circuits 401, 402 including 4 more adders and 2 more multiplexers than that required by a conventional radix-2 ACSU 300 shown in FIG. 3.

Further, interconnection between BMU 102 and ACSU 104 cause longer routing delays because the ACSU circuit 104 takes more area and hence interconnections between the ACS cell 104 and BMU 102 as shown in FIG. 5 become complicated. Regarding a FPGA implementation, the ACSU 104 is expected to be fitted into several slices or logic cells; and hence, the routing delay gets even more dominant and comprises about 50% of the critical path delay.

In view of the foregoing, it is both advantageous and desirable to provide a branch metric duplication method that substantially reduces interconnection delays in order to implement a high speed radix-4 Viterbi decoder targeted for FPGA applications.

SUMMARY OF THE INVENTION

The present invention is directed to a branch metric duplication method that substantially reduces interconnection delays. The branch metric duplication method is particularly useful to implement a high speed radix-4 Viterbi decoder targeted for FPGA applications.

According to one embodiment, a method of reducing interconnection delays associated with a Viterbi-decoder comprises the steps of providing a plurality of branch metric computation units (BMCUs) and at least one add-compare-select unit (ACSU) having a plurality of cells; connecting a first BMCU selected from the plurality of BMCUs to a first group of ACSU cells selected from the plurality of ACSU cells; and connecting a second BMCU selected from the plurality of BMCUs to a second group of ACSU cells selected from the plurality of ACSU cells.

According to another embodiment, a high speed radix-4 Viterbi decoder comprises a field programmable gate array (FPGA) comprising a plurality of branch metric computation units (BMCUs) and at least one add-compare-select unit (ACSU) having a plurality of cells, wherein a first BMCU selected from the plurality of BMCUs is connected to a first group of ACSU cells selected from the plurality of ACSU cells, and a second BMCU selected from the plurality of BMCUs is connected to a second group of ACSU cells selected from the plurality of ACSU cells; and a survivor path memory unit (SMU), wherein the plurality of BMCUs, the at least one ACSU, and the SMU are configured in the FPGA to implement a radix-4 Viterbi decoder.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
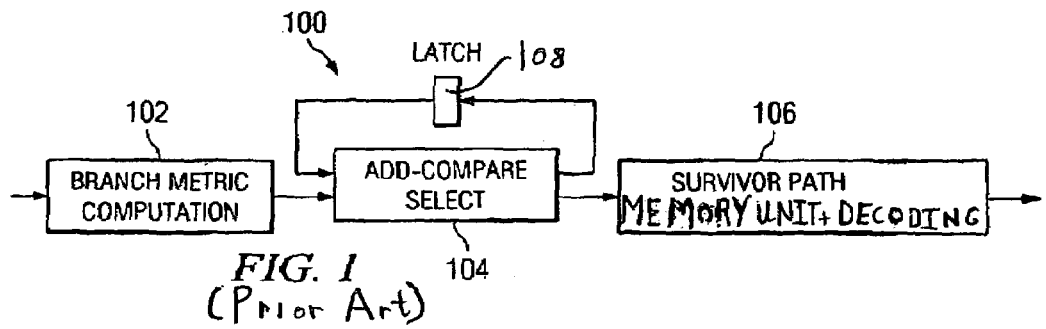
FIG. 1 is a system block diagram illustrating a conventional Viterbi decoder.
Figure 2:
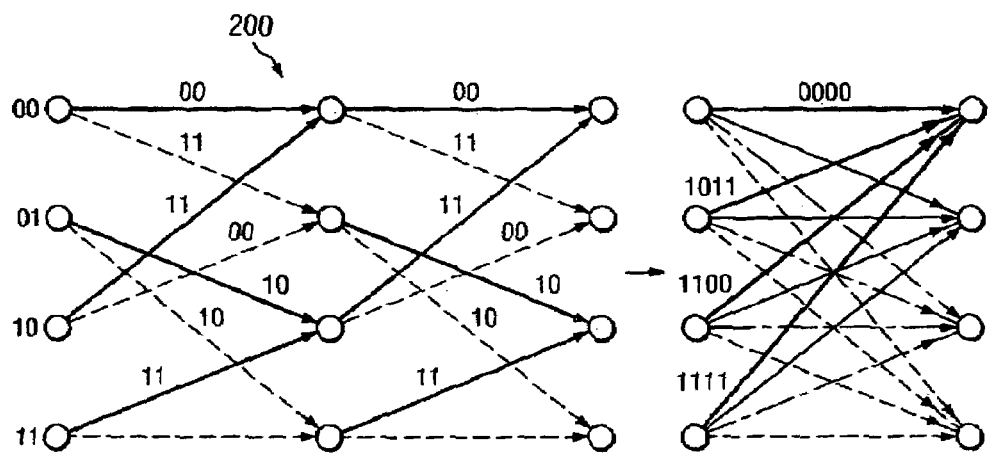
FIG. 2 is a diagram illustrating a radix-4 trellis for K=3,4 states.
Figure 3:
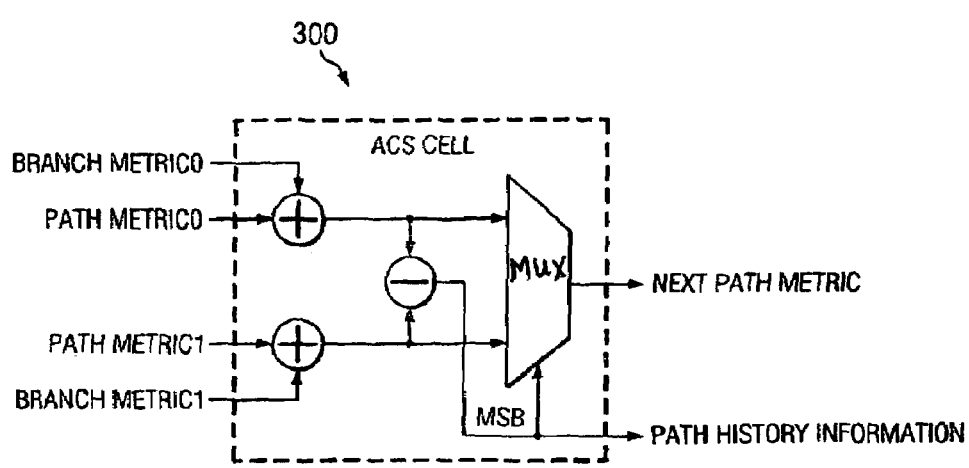
FIG. 3 is a circuit diagram illustrating a conventional radix-2 add-compare-select circuit.
Figure 4:
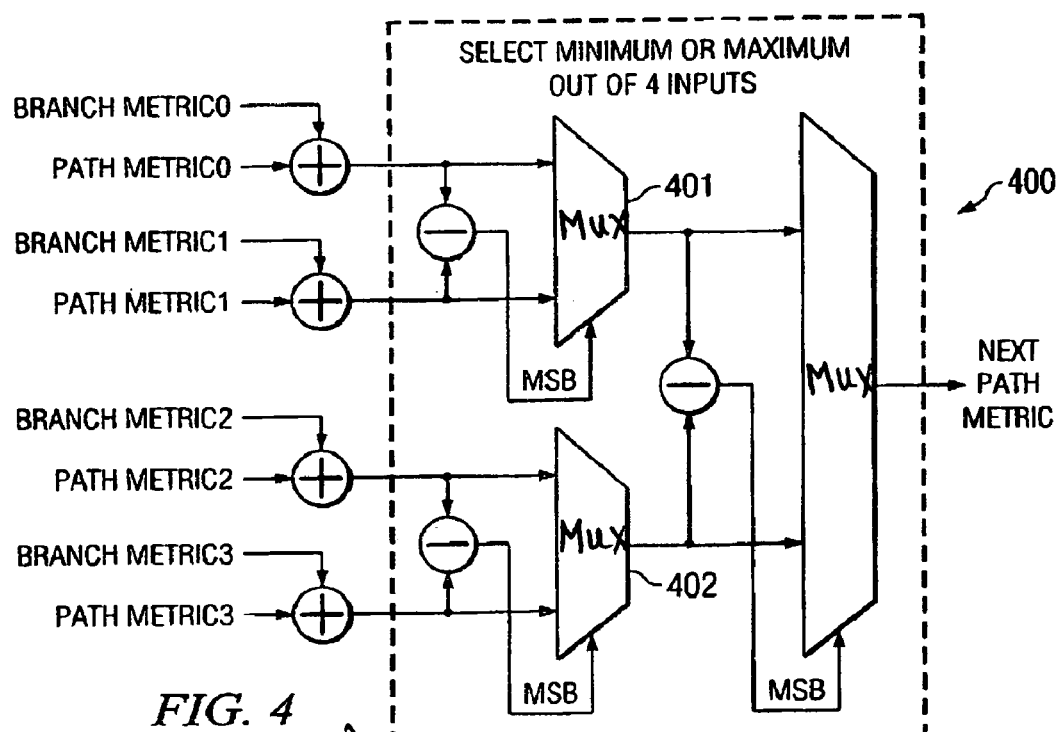
FIG. 4 is a circuit diagram illustrating a conventional radix-4 add-compare-select circuit.
Figure 5:
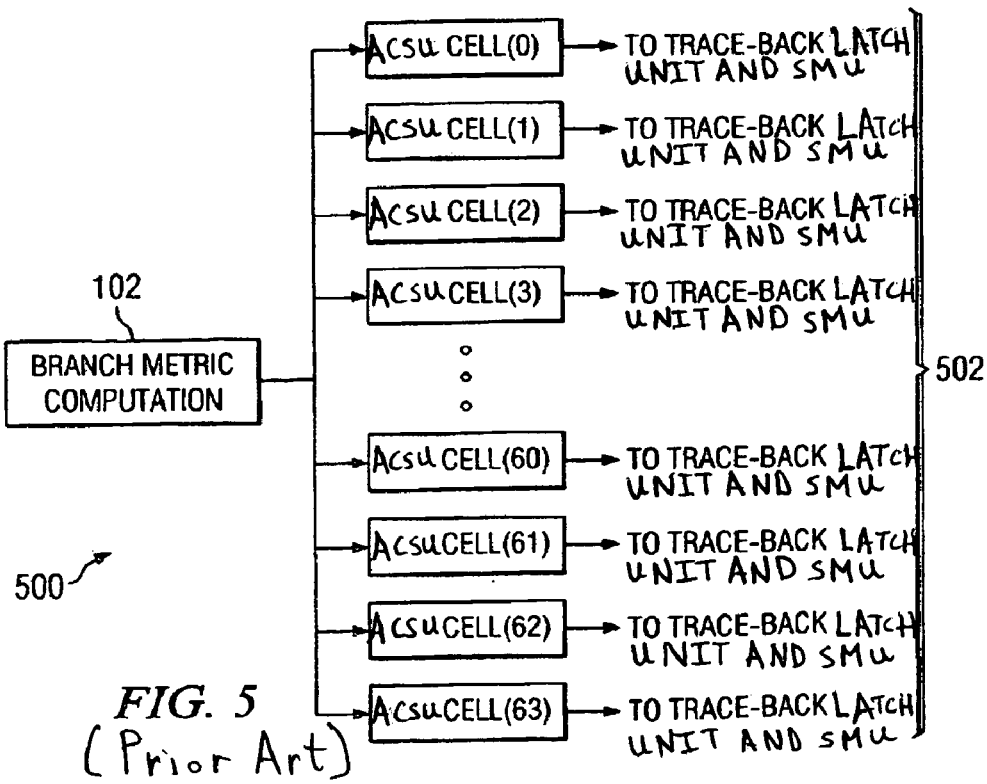
FIG. 5 is a block diagram illustrating application of BMC unit to an ACS unit.

Looking again at FIG. 5, a conventional architecture 500 comprises one branch metric computation (BMC) unit 102 and 64-state ACS unit 104 cells. If this architecture 500 is fitted into a FPGA, the interconnections between the BMC unit 102 and the 64 ACS unit cells 502 as well as the logic gates of 64 states are mapped into several slices. This undesirably causes long routing delays.

Figure 6:
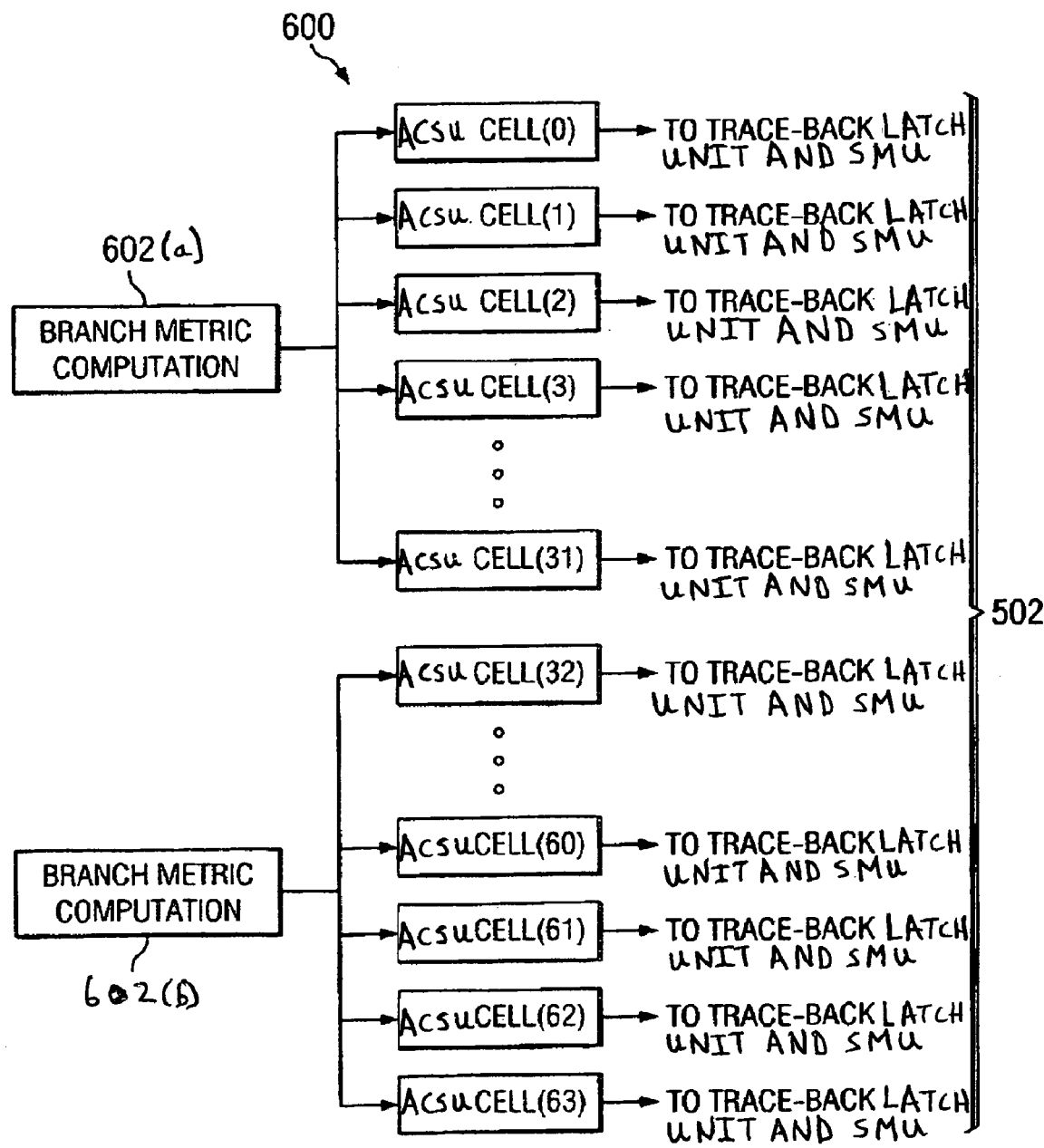
FIG. 6 is a block diagram illustrating a technique for reducing interconnection delays between the BMC unit and the ACS unit shown in FIG. 5, according to one embodiment of the present invention.

FIG. 6 is a block diagram illustrating a technique 600 for reducing interconnection delays between the BMC unit 102 and the ACS unit 104 shown in FIG. 5, according to one embodiment of the present invention. Specifically, technique 600 reduces the interconnection delay between the branch metric computation unit 102 and 64-state ACS cells 502 by employing two identical branch metric computation logics 602(a) and 602(b) in place of the single BMCU 102 seen in FIG. 5.

The present inventors employed synthesis and place and route techniques to discover that technique 600 desirably achieved improved (higher) speed (greater throughput). Table 1 below summarizes theses synthesis and place and route results applied to a Viterbi decoder implemented in a FPGA.

TABLE 1

Synthesis Results for Viterbi Decoder Using FPGA

| Circuit | Speed after Synthesis | Speed after Place & Route | Logic Usages (number of used slices) |
|---|---|---|---|
| FIG. 5 | 81.5 MHz | 67.899 MHz | 30% |
| FIG. 6 | 90.0 MHz | 79.526 MHz | 31% |

In summary explanation of the above, a branch metric unit duplication method 600 was shown to achieve FPGA implementation for a high speed radix-4 Viterbi decoder. Synthesis and place and route results verified the branch metric unit duplication method 600 improves radix-4 Viterbi decoder speed from 67.889 MHz to 79.526 MHz at the modest cost of only a small amount of hardware increase.

In view of the above, it can be seen the present invention presents a significant advancement in the art of Viterbi decoders. Further, this invention has been described in considerable detail in order to provide those skilled in the FPGA art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of reducing interconnection delays associated with a decoder, the method comprising:
providing a plurality of branch metric computation units (BMCUs) and at least one add-compare-select unit (ACSU), wherein the ACSU includes a plurality of cells;
connecting a first BMCU selected from the plurality of BMCUs to a first group of ACSU cells selected from the plurality of ACSU cells, wherein the first BMCU receives first input data;
connecting a second BMCU selected from the plurality of BMCUs to a second group of ACSU cells selected from the plurality of ACSU cells, wherein the second BMCU receives second input data, wherein the interconnection delays are reduced.

2. The method of claim 1, further comprising providing a survivor path memory unit (SMU).

3. The method of claim 2, further comprising:
configuring the plurality of BMCUs, the at least one ACSU, and the SMU to implement a decoder with reduced interconnection delays.

4. The method of claim 3, wherein the decoder is a radix-4 Viterbi decoder.

5. The method of claim 3, wherein the decoder is implemented in a logic device.

6. The method of claim 5, wherein the logic device is a field programmable gate array (FPGA).

7. The method of claim 1, further comprising:
using a first group of interconnections to connect the first BMCU to the first group of ACSU cells, wherein the first group of interconnections are mapped into a first plurality of logic cells; and
using a second group of interconnections to connect the second BMCU to the second group of ACSU cells, wherein the second group of interconnections are mapped into a second plurality of logic cells.

8. An apparatus, comprising:
a plurality of branch metric computation units (BMCUs); and
at least one add-compare-select unit (ACSU) coupled to the plurality of BMCUs, wherein the ACSU includes a plurality of cells,
wherein a first BMCU selected from the plurality of BMCUs is connected to a first group of ACSU cells selected from the plurality of ACSU cells, and a second BMCU selected from the plurality of BMCUs is connected to a second group of ACSU cells selected from the plurality of ACSU cells, the first BMCU arranged to receive first input data and the second BMCU arranged to receive second input data, wherein the interconnection delays are reduced.

9. The apparatus of claim 8, further comprising a survivor path memory unit (SMU) coupled to the at least one ACSU.

10. The apparatus of claim 8, wherein the apparatus is a radix-4 Viterbi decoder.

11. The apparatus of claim 8, wherein the apparatus is implemented in a logic device.

12. The apparatus of claim 11, wherein the logic device is a field programmable gate array (FPGA).

13. The apparatus of claim 8, comprising:
a first group of interconnections connecting the first BMCU to the first group of ACSU cells, wherein the first group of interconnections are mapped into a first plurality of logic cells; and
a second group of interconnections connecting the second BMCU to the second group of ACSU cells, wherein the second group of interconnections are mapped into a second plurality of logic cells.

14. A logic device, comprising:
a plurality of branch metric computation units (BMCUs);
at least one add-compare-select unit (ACSU) coupled to the plurality of BMCUs, wherein the ACSU includes a plurality of cells, wherein a first BMCU selected from the plurality of BMCUs is connected to a first group of ACSU cells selected from the plurality of ACSU cells, and a second BMCU selected from the plurality of BMCUs is connected to a second group of ACSU cells selected from the plurality of ACSU cells;

a first group of interconnections connecting the first BMCU to the first group of ACSU cells, wherein the first group of interconnections are mapped into a first plurality of logic cells; and a second group of interconnections connecting the second BMCU to the second group of ACSU cells, wherein the second group of interconnections are mapped into a second plurality of logic cells, wherein interconnection delays are reduced.

15. The logic device of claim 14, further comprising a survivor path memory unit (SMU) coupled to the at least one ACSU.

16. The logic device of claim 14, wherein the logic device is a decoder.

17. The logic device of claim 16, wherein the logic device is a radix-4 Viterbi decoder.

18. The logic device, wherein the logic device is a field programmable gate array (FPGA).

19. The logic device of claim 14, the first BMCU arranged to receive first input data and the second BMCU arranged to receive second input data.

* * * * *